United States Patent
Muto et al.

(10) Patent No.: US 10,774,444 B2
(45) Date of Patent: Sep. 15, 2020

(54) METHOD FOR PRODUCING SIC EPITAXIAL WAFER INCLUDING FORMING EPITAXIAL LAYER UNDER DIFFERENT CONDITIONS

(71) Applicant: SHOWA DENKO K.K., Tokyo (JP)

(72) Inventors: Daisuke Muto, Hikone (JP); Akira Miyasaka, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 162 days.

(21) Appl. No.: 16/063,911

(22) PCT Filed: Dec. 12, 2016

(86) PCT No.: PCT/JP2016/086895
§ 371 (c)(1),
(2) Date: Jun. 19, 2018

(87) PCT Pub. No.: WO2017/110550
PCT Pub. Date: Jun. 29, 2017

(65) Prior Publication Data
US 2018/0371641 A1 Dec. 27, 2018

(30) Foreign Application Priority Data
Dec. 24, 2015 (JP) .................. 2015-250942

(51) Int. Cl.
*C30B 25/16* (2006.01)
*C30B 29/36* (2006.01)
(Continued)

(52) U.S. Cl.
CPC ............ *C30B 29/36* (2013.01); *C23C 16/325* (2013.01); *C23C 16/45523* (2013.01);
(Continued)

(58) Field of Classification Search
CPC ......... C30B 25/02; C30B 25/14; C30B 25/16; C30B 25/165; C30B 25/183; C30B 25/20;
(Continued)

(56) References Cited

U.S. PATENT DOCUMENTS

| | | | | |
|---|---|---|---|---|
| 4,592,792 A | * | 6/1986 | Corboy, Jr. | ....... H01L 21/76294 117/102 |
| 7,901,508 B2 | | 3/2011 | Makarov et al. | |

(Continued)

FOREIGN PATENT DOCUMENTS

| | | |
|---|---|---|
| JP | 2000-001398 A | 1/2000 |
| JP | 2007-525402 A | 9/2007 |

(Continued)

OTHER PUBLICATIONS

International Search Report for PCT/JP2016/086895 dated Feb. 14, 2017 [PCT/ISA/210].

*Primary Examiner* — Kenneth A Bratland, Jr.
(74) *Attorney, Agent, or Firm* — Sughrue Mion, PLLC

(57) ABSTRACT

This method of producing a SiC epitaxial wafer having an epitaxial layer on a SiC single crystal substrate, and includes: when performing crystal growth of the epitaxial layer, a step of forming a part of an epitaxial layer under first conditions at an initial stage where the crystal growth is started; and a step of forming a part of a SiC epitaxial layer under second conditions in which a Cl/Si ratio is decreased and a C/Si ratio is increased in comparison to those in the first conditions, wherein the C/Si ratio is equal to or less than 0.6 and the Cl/Si ratio is equal to or more than 5.0 in the first conditions.

11 Claims, 6 Drawing Sheets

(51) Int. Cl.
*H01L 21/02* (2006.01)
*C30B 25/18* (2006.01)
*C23C 16/32* (2006.01)
*C23C 16/455* (2006.01)
*C30B 25/20* (2006.01)

(52) U.S. Cl.
CPC .......... *C30B 25/165* (2013.01); *C30B 25/183* (2013.01); *C30B 25/20* (2013.01); *H01L 21/0262* (2013.01); *H01L 21/02378* (2013.01); *H01L 21/02433* (2013.01); *H01L 21/02447* (2013.01); *H01L 21/02529* (2013.01); *H01L 21/02634* (2013.01)

(58) Field of Classification Search
CPC ....... C30B 29/10; C30B 29/36; C23C 16/455; C23C 16/45523; H01L 21/02378; H01L 21/02433; H01L 21/02447; H01L 21/02529; H01L 21/0262; H01L 21/02634
USPC ........ 117/84, 88–89, 93, 102, 104–105, 937, 117/951
See application file for complete search history.

(56) References Cited

U.S. PATENT DOCUMENTS

| | | | |
|---|---|---|---|
| 8,802,546 B2 | 8/2014 | Kawada et al. | |
| 2011/0278596 A1 | 11/2011 | Aigo et al. | |
| 2013/0217213 A1* | 8/2013 | Aigo | ................ C30B 25/02 438/478 |
| 2015/0361585 A1 | 12/2015 | Aigo et al. | |

FOREIGN PATENT DOCUMENTS

| | | |
|---|---|---|
| JP | 2008-074664 A | 4/2008 |
| JP | 2012-178492 A | 9/2012 |
| JP | 2013-239606 A | 11/2013 |
| JP | 2014-047090 A | 3/2014 |
| JP | 2014-058411 A | 4/2014 |
| JP | 2014-099483 A | 5/2014 |
| JP | 2015-510691 A | 4/2015 |
| WO | 2005/093137 A1 | 10/2005 |
| WO | 2010/087518 A1 | 8/2010 |
| WO | 2013/115711 A2 | 8/2013 |
| WO | 2014/196394 A1 | 12/2014 |

* cited by examiner

METHOD FOR PRODUCING SIC EPITAXIAL WAFER INCLUDING FORMING EPITAXIAL LAYER UNDER DIFFERENT CONDITIONS

TECHNICAL FIELD

The present invention relates to a method of producing a SiC epitaxial wafer. This application is a National Stage of International Application No. PCT/JP2016/086895, filed on Dec. 12, 2016, which claims priority from Japanese Patent Application No. 2015-250942, filed Dec. 24, 2015, the content of which is incorporated herein by reference.

BACKGROUND ART

Silicon carbide (SiC) has many excellent properties. For example, compared to silicon (Si), the dielectric breakdown field is larger by one order of magnitude, the band gap is three times larger, and the thermal conductivity is about three times higher. Silicon carbide (SiC) is expected to be applied to power devices, high frequency devices, high temperature operation devices, and the like.

For promoting the practical application of SiC devices, it is essential to establish high-quality SiC epitaxial wafers and high-quality epitaxial growth techniques.

SiC devices are fabricated using SiC epitaxial wafers. The SiC epitaxial wafers are obtained by growing an epitaxial layer (film) to serve as an active region of the device through a chemical vapor deposition (CVD) method or the like on a SiC single crystal substrate obtained by processing from a SiC bulk single crystal grown by a sublimation recrystallization method or the like.

For example, a 4H epitaxial layer is grown by the step-flow growth of SiC (lateral growth from an atomic step) on a SiC single crystal substrate whose growth plane is a plane having an off angle in the <11-20> direction from the (0001) plane.

Among defects contained in the SiC epitaxial wafers, there are defects called carrot defects (carrot type defects, carrot shaped defects) having characteristic shapes exposed on the surface of the epitaxial layer. The carrot defects are representative of defects appearing on the surface of the epitaxial layer, as well as triangular defects, comet defects, and the like. It is desired to reduce the carrot defects in producing the epitaxial wafer for semiconductor devices for which crystal integrity is required since the carrot defects are numerous in numbers and also as large as several tens of micrometers in shape (Patent Documents 1 to 3).

It has been elucidated that the structure of the carrot defect is constituted by a basal plane stacking fault and a prismatic stacking fault and is defined as a distinguishable defect in the field of SiC epitaxial growth. The carrot defects are thought to be formed such that threading dislocations and the like included in the substrate are converted at the time of epitaxial growth.

Several methods have been proposed as a method for reducing the carrot defect density. Patent Document 1 describes a method in which a first epitaxial layer is grown, and then the growth is stopped and the surface is etched, followed by the growth of a second epitaxial layer. Patent Document 2 describes a method of providing a suppression layer of a source gas composition having a low C/Si ratio. Patent Document 3 describes a method of using a substrate in which a pit due to a specific screw dislocation is formed into a certain shape by CMP processing.

CITATION LIST

Patent Documents

Patent Document 1: Published Japanese Translation No. 2007-525402 of the PCT International Publication
Patent Document 2: Japanese Unexamined Patent Application, First Publication No. 2008-74664
Patent Document 3: International Patent Publication No. 2014/196394

SUMMARY OF INVENTION

Technical Problem

However, if the C/Si ratio is set too low, there is a problem in that Si droplets tend to occur during epitaxial growth. Si droplets are formed by the condensation of excessive Si atoms on the surface of the substrate and cause crystal defects due to the condensation.

For example, when the SiC epitaxial layer is actually grown under the condition of the low C/Si ratio of Patent Document 2, it was impossible to suppress both the carrot defects and the generation of droplets at the same time. That is, there is no known method of stably obtaining an epitaxial wafer with a small number of carrot defects.

As described above, if the C/Si ratio is lowered in an attempt to reduce carrot defects, Si droplets tend to occur. Therefore, a method for producing a SiC epitaxial wafer capable of suppressing the occurrence of both carrot defects and Si droplets is required.

The present invention has been made in view of the above problems, and has an object to obtain a method for producing a SiC epitaxial wafer capable of suppressing the occurrence of carrot defects and Si droplets at the same time.

Solution to Problem

As a result of intensive studies, the inventors of the present invention have found that by reducing the C/Si ratio and increasing the Cl/Si ratio at an initial stage of crystal growth and gradually changing the respective growth conditions in the growth process, the occurrence of carrot defects and Si droplets can be suppressed at the same time, thereby completing the invention.

That is, the present invention provides the following means in order to solve the above-mentioned problems.

(1) A method of producing a SiC epitaxial wafer according to an aspect of the present invention is a method of producing a SiC epitaxial wafer having an epitaxial layer on a SiC single crystal substrate, wherein the method including: when performing crystal growth of the epitaxial layer, a step of forming a part of an epitaxial layer under first conditions at an initial stage where the crystal growth is started; and a step of forming a part of a SiC epitaxial layer under second conditions in which a Cl/Si ratio is decreased and a C/Si ratio is increased in comparison to those in the first conditions, wherein the C/Si ratio is equal to or less than 0.6 and the Cl/Si ratio is equal to or more than 5.0 in the first conditions.

(2) In the aforementioned first conditions in the method for producing a SiC epitaxial wafer according to the above (1), chlorosilane ($SiH_{4-n}Cl_n$: n=0 to 4) and hydrogen chloride (HCl) may be used together as supply sources of Cl element.

(3) In the method for producing a SiC epitaxial wafer according to either one of the above (1) and (2), the C/Si ratio in the aforementioned second conditions is from 0.8 to 1.5, and the Cl/Si ratio may be from 0 to 4.

(4) In the method for producing a SiC epitaxial wafer according to any one of the above (1) to (3), when performing crystal growth of the epitaxial layer, a ramping step is performed wherein the C/Si ratio is gradually decreased and the Cl/Si ratio is gradually increased from the aforementioned first conditions to the aforementioned second conditions.

(5) In the method for producing a SiC epitaxial wafer according to the above (4), the aforementioned epitaxial layer includes a buffer layer and a drift layer in this order from the aforementioned SiC single crystal substrate side, and the aforementioned ramping step may be carried out when growing the aforementioned buffer layer.

(6) In the method for producing a SiC epitaxial wafer according to the above (5), a time required for the aforementioned ramping step may be equal to or more than ⅕ of a time required for forming the aforementioned buffer layer.

(7) In the method for producing an epitaxial wafer according to either one of the above (5) and (6), a layer thickness of an epitaxial layer grown as crystals in the aforementioned ramping step may be equal to or more than 0.1 μm.

(8) In the method for producing an epitaxial wafer according to any one of the above (5) to (7), the aforementioned ramping step may be started simultaneously with the start of growth of the aforementioned epitaxial layer.

Advantageous Effects of Invention

According to the method for producing a SiC epitaxial wafer according to one aspect of the present invention, the occurrence of carrot defects and Si droplets can be suppressed at the same time.

DESCRIPTION OF EMBODIMENTS

Figure 1:
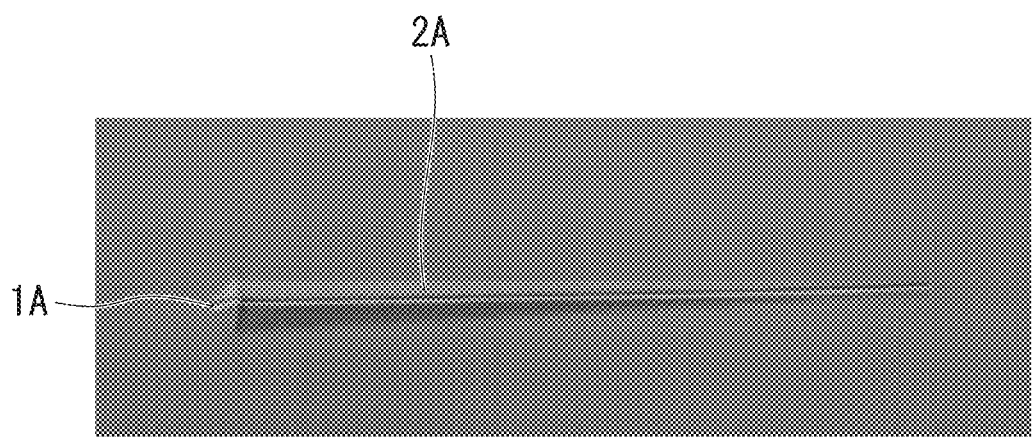
FIG. 1 shows an image of a carrot defect obtained by a confocal microscope which is a surface inspection apparatus using a confocal differential interference optical system.

Hereinafter, a method for producing a SiC epitaxial wafer according to the present embodiment will be described in detail with appropriate reference to the drawings. In the drawings used in the following description, characteristic portions may be shown in an enlarged manner in some cases for the sake of simplicity in order to facilitate understanding of the characteristics of the present invention, and the dimensional ratio or the like of each constituent may be different from that employed in reality. Materials, dimensions, and the like exemplified in the following description are merely examples, and the present invention is not limited thereto and can be carried out with appropriate modifications without departing from the scope and spirit of the invention.

(Carrot Defect)

Figure 2:
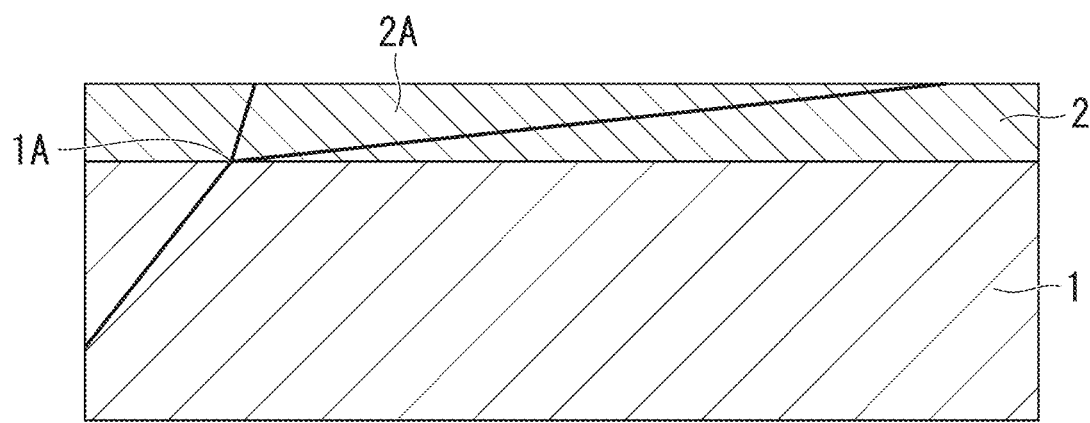
FIG. 2 shows a schematic cross-sectional view of a SiC epitaxial wafer in the vicinity of a carrot defect.

FIG. 1 is an image of a carrot defect obtained by a confocal microscope (SICA 6X, manufactured by Lasertec Corporation) which is a surface inspection apparatus using a confocal differential interference optical system. Further, FIG. 2 is a schematic cross-sectional view of a SiC epitaxial wafer in the vicinity of a carrot defect. In FIG. 1 and FIG. 2, the left side in the drawing is the upstream side of the step flow, and the right side in the drawing is the downstream side of the step flow.

A carrot defect is generated based on a threading dislocation present in the SiC single crystal substrate or a scratch on the substrate serving as a starting point. The scratches on the substrate can be eliminated by optimizing the processing conditions. Therefore, the threading dislocation present in the SiC substrate is important as a cause of occurrence to be solved in order to reduce the carrot defects. In the carrot defect in FIG. 2, a prism-plane stacking fault 2A is formed such that a threading screw dislocation 1A in the SiC single crystal substrate is used as a starting point. As a result, the defect is in the shape of a carrot, when the defect is seen from the surface side of an epitaxial layer 2. The carrot defect may become a device killer defect which causes an increase in leakage current or the like when incorporated in a SiC device.

(Si Droplet, Si Droplet-Induced Defect)

A Si droplet is foreign matter formed by the condensation of excessive Si atoms on the substrate surface during epitaxial growth, and due to this droplet, Si droplet-induced defect is formed. The Si droplet is one form of foreign matter and this droplet serves as a starting point to generate the disturbance of crystal growth, and a defect having the shape of a small pit or bump occurs on the epitaxial surface. Since the foreign matter serves as the starting point, the defect is different from the carrot defect whose starting point is a dislocation or the like. The Si droplet is small and the Si droplet-induced defect is also small, since a condition of extremely excessive level of Si is not adopted when actually performing epitaxial growth. Si droplet defects can be distinguished from other defects by their size and morphological features. Si droplet-induced defects are also the disturbance of crystallinity or crystal growth surface, and the defects tend to occur at once in large numbers when they occur, and therefore they adversely affect the device production.

As described above, the carrot defects and the Si droplets are the causes for generating failures in the SiC device, and thus their reduction is required.

(Method for Producing SiC Epitaxial Layer)

The method for producing a SiC epitaxial wafer according to the present embodiment is a method for producing a SiC epitaxial wafer having an epitaxial layer on a SiC single crystal substrate, and includes, when performing crystal growth of the epitaxial layer, a step of forming a part of the epitaxial layer under first conditions at an initial stage where the crystal growth is started; and a step of forming a part of a SiC epitaxial layer under second conditions in which a Cl/Si ratio is decreased and a C/Si ratio is increased in comparison to those in the first conditions. In this case, the C/Si ratio under the first conditions is equal to or less than 0.6 and the Cl/Si ratio is equal to or more than 5.0.

Hereinafter, a method for producing a SiC epitaxial wafer according to one aspect of the present invention will be specifically described.

The SiC epitaxial wafer is obtained by forming an epitaxial layer on a SiC single crystal substrate. Therefore, first, the SiC single crystal substrate is prepared.

There is no particular limitation on the method for producing the SiC single crystal substrate. For example, it can be obtained by slicing a SiC ingot obtained by a sublimation method or the like.

The surface of the obtained SiC single crystal substrate is subjected to chemical mechanical polishing (CMP) to remove the damage generated by processing, and finished to a flat mirror surface.

As the plane orientation of the substrate, one having a (0001) plane provided with an off angle is used. Those having an off angle of 0.4° to 8° can be used, and those that are 4° off, that is, having an off angle of 3.5° to 4.5° are preferably used.

Next, an epitaxial layer is epitaxially grown on the SiC single crystal substrate to produce a SiC epitaxial wafer.

The epitaxial layer is obtained by the step flow growth (lateral growth from atomic steps) of SiC on the growth surface of the SiC single crystal substrate by, for example, a chemical vapor deposition (CVD) method performed under reduced pressure or the like.

As the source gases for SiC epitaxial growth, silanes or chlorosilanes are used as a silane-based gas, and hydrocarbons such as ethylene or propane are used as a carbon-based gas. Further, a nitrogen gas or the like is added as a dopant. An inert gas such as hydrogen and Ar is used as a carrier gas for carrying these source gases. In addition, HCl may be added as a chlorine-based gas for the purpose of improving the growth rate and the like.

In the growth of SiC, since the ratio of Si and C on the surface during crystal growth greatly influences the incorporation of impurities, growth morphology and the like, the C/Si ratio of the source gas is an important parameter to be controlled. In addition, since the presence of Cl in the vicinity of the crystal growth surface affects crystal growth, the Cl/Si ratio is also important as a parameter.

The C/Si ratio is the ratio of the C element and the Si element in the growth space, and is obtained from the silane-based gas and the carbon-based gas. The Cl/Si ratio is the ratio of the Cl element and the Si element in the growth space, and is obtained from the chlorine-based gas or the total of the silane-based gas and the chlorine-based gas, and the silane-based gas. When chlorosilane ($SiH_{4-n}Cl_n$: n=0 to 4) is used as the silane-based gas, since the Cl element in the silane-based gas also contributes to the Cl/Si ratio, the Cl ratio in the Cl/Si ratio is obtained from the sum of the Cl element in the silane-based gas and the Cl element in the Cl source gas.

Figure 3:
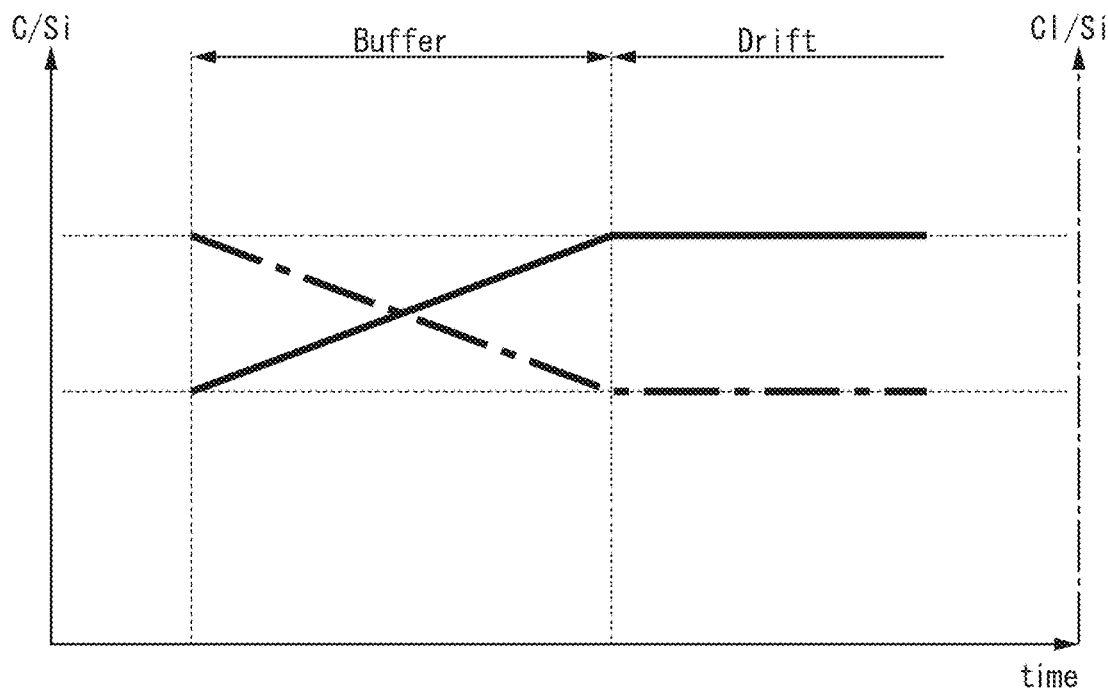
FIG. 3 shows a diagram schematically showing changes in C/Si ratio and Cl/Si ratio when an epitaxial layer is epitaxially grown on a SiC single crystal substrate.

FIG. 3 is a diagram schematically showing changes in C/Si ratio and Cl/Si ratio when an epitaxial layer is epitaxially grown on a SiC single crystal substrate. In FIG. 3, the graph indicated by the solid line shows the change in the C/Si ratio, and the graph indicated by the alternate long and short dash line shows the change in the Cl/Si ratio.

Further, in FIG. 3, "Buffer" corresponds to the growth conditions in growing the buffer layer, and "Drift" corresponds to the growth conditions in growing the drift layer.

Here, the buffer layer is a layer for alleviating the difference in carrier concentration between the drift layer and the SiC single crystal substrate. The drift layer is a portion where an active layer is formed when forming a device, and the thickness and the carrier concentration are respectively selected depending on the device to be produced. Since SiC is used for a high breakdown voltage device, the carrier concentration of the drift layer is, for example, as low as about $1 \times 10^{16}$ $cm^{-3}$. On the other hand, the SiC single crystal substrate has a high carrier concentration of about $1 \times 10^{18}$ $cm^{-3}$ or more. Therefore, it is common to provide a buffer layer having an intermediate carrier concentration therebetween. The thickness of the buffer layer is not particularly limited, but in consideration of economic efficiency, a layer with a thickness of about 0.3 μm to 1 μm is used in many cases.

Since the active layer of the device is formed in the drift layer, the crystallinity and the surface morphology are important, and the growth conditions of the drift layer, for example, the C/Si ratio is determined with priority given to the characteristics of the drift layer. On the other hand, the growth conditions of the buffer layer are not limited as long as a constant carrier concentration is achieved without adversely affecting the drift layer, so that the degree of freedom in selecting the growth conditions is high.

As shown in FIG. 3, the method for producing a SiC epitaxial wafer according to the present embodiment includes, when performing crystal growth of the epitaxial layer, a step for forming a part of the epitaxial layer under first conditions at an initial stage where the crystal growth is started; and a step for forming a part of a SiC epitaxial layer under second conditions in which a Cl/Si ratio is decreased and a C/Si ratio is increased in comparison to those in the first conditions. Further, from the first conditions to the second conditions, ramping is performed in which the C/Si ratio is gradually increased and the Cl/Si ratio is gradually decreased. Here, the "ramping" refers to gradual changes in the growth conditions, and may include the change wherein the growth conditions are changed in a stepwise manner and the change wherein the growth conditions are changed in a slope-like manner. The ramping step is preferably carried out during the growth of the buffer layer so as not to adversely affect the drift layer.

The C/Si ratio and the Cl/Si ratio can be controlled by controlling the supply amounts of the silane-based gas, the carbon-based gas, and the chlorine-based gas. As the silane-based gas, $SiH_4$, $SiHCl_3$, $SiH_2Cl_2$, $SiH_3Cl$, $SiCl_4$ or the like can be used. Since $SiHCl_3$, $SiH_2Cl_2$, $SiH_3Cl$ and $SiC_4$ contain Cl element, they also function as chlorine-based gases. In addition, HCl can also be used as the chlorine-based gas. Further, as the carbon-based gas, an alkane such as propane can be used.

For example, the Cl/Si ratio can be controlled by controlling $SiH_2Cl_2$ gas and $C_3H_8$ gas and the C/Si ratio can be controlled by changing the supply amount of HCl gas.

In the ramping step, in the first conditions when starting the crystal growth, the C/Si ratio is equal to or less than 0.6 and the Cl/Si ratio is equal to or more than 5.0. Further, the C/Si ratio under the first conditions is preferably from 0.4 to 0.6, and the Cl/Si ratio is preferably from 5.0 to 8.0.

Neither the carrot defects nor the Si droplets can be suppressed at the same time by merely controlling either one condition of the C/Si ratio and the Cl/Si ratio.

For example, when the C/Si ratio is set to 0.6 or less and the Cl/Si ratio is not controlled, the occurrence of carrot defects can be suppressed. However, the ratio of Si in the growth atmosphere is increased, and Si droplets are generated.

On the other hand, when the Cl/Si ratio is set to 5.0 or more and the C/Si ratio is not controlled, carrot defects are generated.

On the other hand, by setting the C/Si ratio and the Cl/Si ratio under the first conditions within these ranges, it is possible to simultaneously suppress the occurrence of carrot defects and Si droplets. By setting the C/Si ratio at the time of starting the crystal growth to 0.6 or less, the occurrence of carrot defects is suppressed.

Furthermore, by increasing the Cl ratio in the growth atmosphere, SiClx is formed on the growth surface, and it is possible to suppress the aggregation of Si atoms with each other and the nuclear growth thereof. In other words, the occurrence of Si droplets can be suppressed.

The crystal growth of the epitaxial layer is preferably performed while gradually changing the growth conditions from the first conditions to the second conditions.

When the crystal growth progresses with the C/Si ratio which remains in the first conditions, the background carrier concentration of the obtained epitaxial layer increases. The background carrier concentration means the carrier concentration of the epitaxial layer obtained when a doping gas (for example, nitrogen or trimethylaluminum) is not supplied. When the carrier concentration is intended to be stably controlled, the background carrier concentration needs to be low. Particularly when controlling a carrier concentration low, it is important to lower the background carrier concentration. That is, a SiC epitaxial wafer having a high background carrier concentration cannot be suitably used for SiC devices. Therefore, in the ramping step, by gradually increasing the C/Si ratio from the first conditions, it is possible to suppress an increase in the background carrier concentration in a region (drift layer) to be used for the SiC device of the epitaxial layer.

On the other hand, when the crystal growth progresses with the Cl/Si ratio which remains in the first conditions, the growth rate of epitaxial growth cannot be increased. A gas containing Cl element etches SiC and contributes to cleaning of the growth surface. However, if the Cl ratio in the growth atmosphere is too high, the growth surface is etched as the epitaxial growth progresses. As a result, the growth rate of the epitaxial layer slows down. A reduction in the growth rate leads to an increase in the production cost of the SiC epitaxial wafer.

The C/Si ratio is gradually increased from the first conditions. For this reason, the growth atmosphere approaches a condition where Si droplets hardly occur. That is, as the ramping step progresses, there is no need to increase the Cl ratio in the growth atmosphere. Accordingly, by gradually decreasing the Cl/Si ratio in conjunction with the increase of the C/Si ratio in the ramping step, it is possible to increase the growth rate while suppressing the occurrence of Si droplets.

Further, in the ramping step, the growth conditions are gradually changed. When the growth conditions are rapidly changed from the first conditions to the second conditions in an actual apparatus, since the growth atmosphere rapidly changes, a portion where the Si concentration is high despite the Cl concentration is low is likely to occur locally. By performing the ramping step, it is possible to avoid the occurrence of a portion where the Si concentration and the Cl concentration locally become high or low, and the occurrence of Si droplets can be further suppressed.

In addition, by gradually switching the growth conditions from the first conditions to the second conditions in the control of the actual apparatus, it is possible to prevent the occurrence of overshoot, and to further suppress the C/Si ratio from becoming excessively high or the Cl/Si ratio from becoming excessively low. By suppressing the C/Si ratio from becoming excessively high, the possibility of carbon deposition can be reduced, and by suppressing the Cl/Si ratio from becoming excessively low, the cleanliness of the growth surface is lowered, and the occurrence of foreign matter or the like can be further suppressed. In the case where the overshoot is made not to occur, the ramping step may be changed in a stepwise manner.

The C/Si ratio in the second conditions after changing the growth conditions is preferably from 0.8 to 1.5, more preferably from 0.9 to 1.2, and still more preferably from 0.95 to 1.1. Further, the Cl/Si ratio is preferably from 0 to 4, more preferably from 1 to 3, and still more preferably from 2 to 3. That is, if the ratio is changed over a sufficiently long period of time, it is possible to ultimately achieve a condition of Cl/Si=0 by using silane as a Si raw material and not using HCl. Further, when $SiHCl_3$ is used without using HCl, the ratio will be Cl/Si=3, and when $SiH_2Cl_2$ is used, the ratio will be Cl/Si=2, so that Si and Cl can be supplied by a single raw material. That is, the Cl element and the Si element can be stably supplied.

If the second conditions are within these ranges, the background carrier concentration in the drift layer can be reduced to an extent to be used for the SiC device. Further, the growth rate of the epitaxial layer does not decrease significantly.

In addition, when growing the epitaxial layer in the first conditions, it is desirable to use chlorosilane as the Si raw material. Since Si and Cl are contained in a single raw material, it is possible to stably maintain the Cl/Si ratio at the substrate surface, and it is possible to reduce the use of HCl which is strongly corrosive and difficult to handle.

Further, in the first conditions, the Cl/Si ratio is equal to or more than 5. Even when $SiHCl_3$ having the highest Cl/Si ratio among the chlorosilanes is used as the Si raw material, the Cl/Si ratio is 3, and HCl needs to be further added. Although $SiCl_4$ can be used as a CVD material for SiC, the Cl/Si ratio is 4 even in this case. That is, in the case of using a Si raw material containing chlorine under the first conditions, by using HCl in combination, a predetermined Cl/Si ratio is realized.

Further, the time required to grow the buffer layer and the time for performing the ramping step do not necessarily have to coincide.

Figure 4:
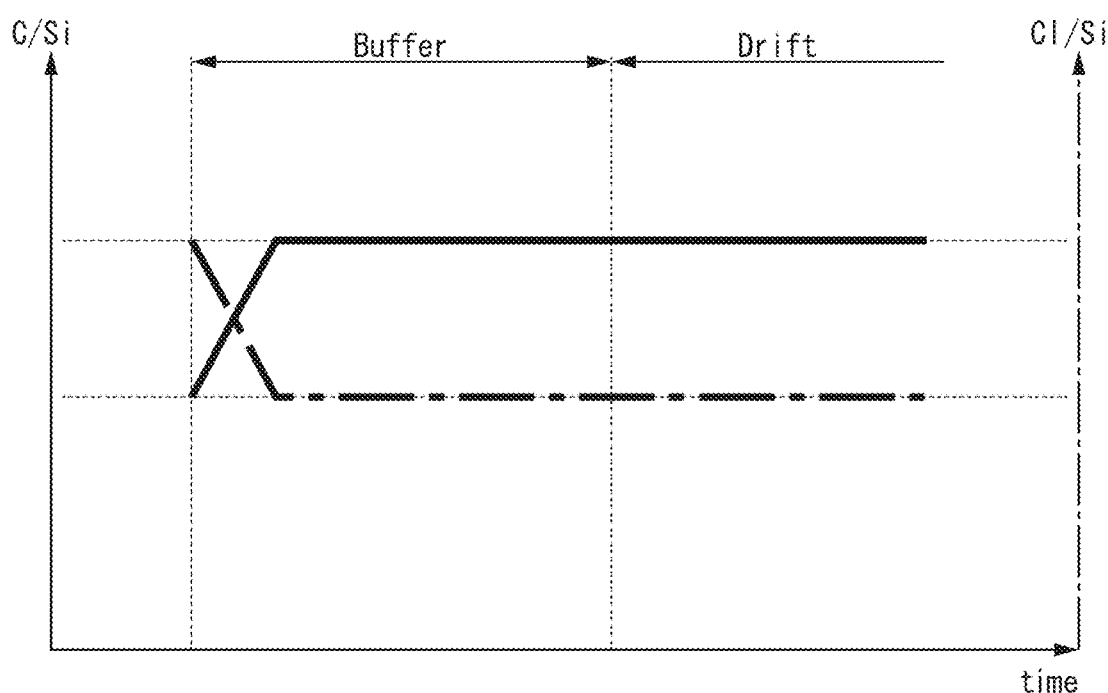
FIG. 4 shows a diagram schematically showing changes in C/Si ratio and Cl/Si ratio when an epitaxial layer is epitaxially grown on a SiC single crystal substrate.

FIG. 4 is a diagram schematically showing changes in C/Si ratio and Cl/Si ratio when an epitaxial layer is epitaxially grown on a SiC single crystal substrate. In FIG. 4, the graph indicated by the solid line shows the change in the C/Si ratio, and the graph indicated by the alternate long and short dash line shows the change in the Cl/Si ratio. "Buffer" corresponds to the growth condition in growing the buffer layer, and "Drift" corresponds to the growth condition in growing the drift layer.

As shown in FIG. 4, the time required for the ramping step may be equal to or more than ⅕ of the time required for forming the buffer layer. When converted to the layer thickness of the epitaxial layer, it may be 0.1 μm or more. If the ramping step is performed within this range, the occurrence of carrot defects and Si droplets can be suppressed at the same time.

Further, it is preferable that the ramping step be started simultaneously with the start of growth of the epitaxial layer.

The carrot defects are generated such that the interface between the substrate and the epitaxial layer is used as a starting point of the defects, and minute lattice disturbance caused by the threading dislocation and surface damage causes the defects. That is, in order to suppress the occurrence of carrot defects, conditions immediately after the start of growth are important, and the influence of subsequent growth conditions is smaller than said conditions. In the method for producing a SiC epitaxial wafer according to the present embodiment, the aforementioned matter was confirmed by ramping the growth conditions. For example, even when the period of growing the epitaxial layer to a thickness of 0.1 μm is changed by ramping, the effect of reducing the carrot defects can be effectively obtained. This indicates that very early growth conditions of the growth are important with respect to the occurrence of carrot defects. Therefore, it is possible to lower the C/Si ratio immediately after the start of growth of the SiC epitaxial layer and to increase the C/Si ratio after that, and the Cl/Si ratio can be lowered in the latter half of the growth. There is a high possibility that Si droplets are generated when the C/Si ratio is low, and this tendency is also the same during epitaxial growth. For this reason, when the C/Si ratio remains low, the Si droplets continue to be generated. Therefore, it is desirable to promptly raise the C/Si ratio except for the required growth period. If the C/Si ratio increases, the Cl/Si ratio can also be reduced accordingly. In other words, by performing the ramping step at the same time as the start of the growth of the epitaxial layer, it is possible to start lowering the Cl/Si ratio at an early stage while lowering the C/Si ratio immediately after the crystal growth, thereby increasing the growth rate of the epitaxial layer.

Further, if it is possible to shorten the ramping period and to accommodate the ramping growth within the growth range of the buffer layer, the conditions of the device layer may not be changed, and the growth conditions of the device layer can be arbitrarily selected.

As described above, according to the method for producing a SiC epitaxial wafer according to one aspect of the present invention, the occurrence of both the carrot defects and the Si droplets can be suppressed.

EXAMPLES

Hereinafter, examples of the present invention will be described. It should be noted that the present invention is not limited only to the following examples.
<3-Inch Substrate>

Example 1

A SiC single crystal substrate obtained by slicing a SiC ingot produced by a sublimation method was used. The size of the SiC single crystal substrate was set to 3 inches. The surface of the SiC single crystal after slicing was subjected to rough polishing and precision polishing by diamond abrasive grains to flatten the growth surface used for epitaxial growth. The polytype of the SiC single crystal substrate is 4H and has an offset angle of 4° with respect to the <11-20> direction with respect to the c-axis.

Carrot defects are related to the threading dislocation density of the substrate. Therefore, in order to improve the accuracy of the effect comparison, in Examples and Comparative Examples, in each of the examination of the 3-inch substrates and the examination of the 4-inch substrates, those having the same level of defect density obtained from the same ingot were used.

Subsequently, a SiC single crystal substrate was introduced into a growth furnace, and an epitaxial layer was grown to a thickness of 10.5 μm while supplying dichlorosilane and propane as source gases and HCl as an etching gas to the surface of the 4H-SiC single crystal substrate. The C/Si ratio was changed by changing the flow rates of dichlorosilane and propane, and the Cl/Si ratio was changed by adjusting the flow rate of HCl correspondingly. For the epitaxial layer, a buffer layer of 0.5 μm (thickness including that obtained in the ramping step) with a high carrier concentration and a drift layer of 10 μm with a low carrier concentration were successively grown. Nitrogen was used as a dopant.

The growth conditions of the epitaxial layer were as follows.
Growth pressure: 15 kPa
Growth temperature: 1,600° C.
Crystal growth conditions (C/Si ratio, Cl/Si ratio)
First conditions: C/Si ratio 0.6, Cl/Si ratio 5.0
Second conditions: C/Si ratio 1.0, Cl/Si ratio 3.0
Layer thickness of the epitaxial layer formed in the ramping step: 0.5 μm
Layer thickness of buffer layer: 0.5 μm Foreign matter on the epitaxial layer surface of the obtained SiC epitaxial wafer was measured. The foreign matter was measured using Candela CS 20 manufactured by KLA-Tencor Corporation, and the size of the foreign matter was specified from the scattering cross section of the scattered light. It was confirmed beforehand that there was a correlation between the size measured by the Candela evaluation using the scattering cross section and the foreign matter species.

Figure 5:
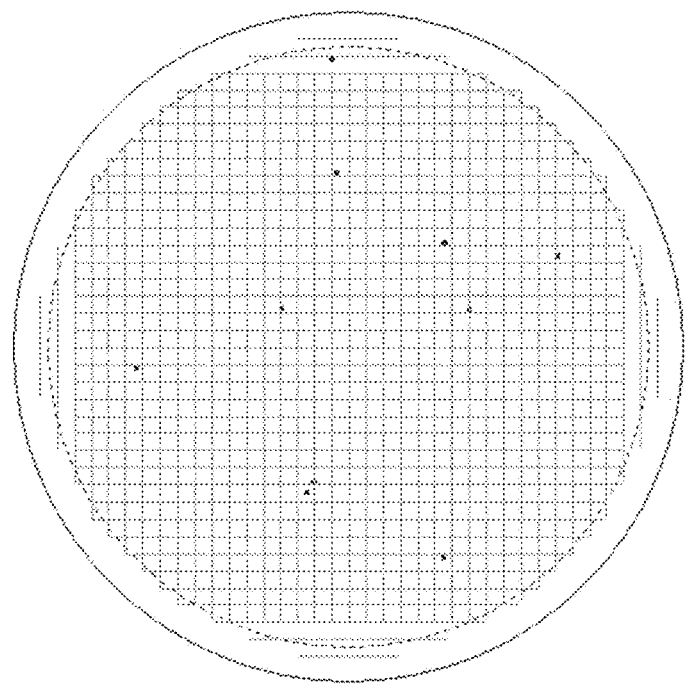
FIG. 5 shows a map of carrot defects on an epitaxial layer surface of a SiC epitaxial wafer of Example 1.

As a result, the number of carrot defects was 10, and almost no Si droplets were found. When Si droplets occurred, since they occurred in large numbers, the number was not counted. In addition, Si droplets are observed as Si droplet-induced defects on the surface of the epitaxial layer. Hereinafter, the Si droplets themselves and the Si droplet-induced defects are expressed as Si droplets. FIG. 5 shows a map of carrot defects on the epitaxial layer surface of the SiC epitaxial wafer of Example 1.

Comparative Example 1

In Comparative Example 1, a SiC epitaxial wafer was fabricated under the same conditions as in Example 1 except that the epitaxial growth conditions were changed.

In Comparative Example 1, the following conditions were adopted as the crystal growth conditions (C/Si ratio, Cl/Si ratio) without changing them in the middle.
Crystal growth conditions: C/Si ratio 1.0, Cl/Si ratio 3.0

Figure 6:
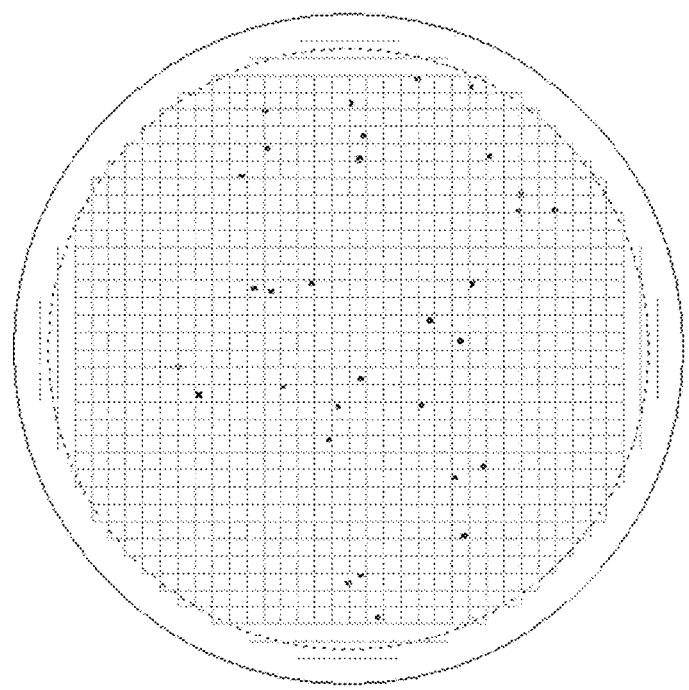
FIG. 6 shows a map of carrot defects on an epitaxial layer surface of a SiC epitaxial wafer of Comparative Example 1.

The surface of the obtained SiC epitaxial wafer was measured by the same means as in Example 1. As a result, the number of carrot defects was 31, and almost no Si droplets were found. FIG. 6 shows a map of carrot defects on the epitaxial layer surface of the SiC epitaxial wafer of Comparative Example 1.

Comparative Example 2

In Comparative Example 2, a SiC epitaxial wafer was fabricated under the same conditions as in Example 1 except that conditions of the C/Si ratio and the Cl/Si ratio at the initial stage of the start of epitaxial growth were changed.

In Comparative Example 2, the following conditions were adopted as the first conditions of the crystal growth conditions.

Crystal growth conditions (C/Si ratio, Cl/Si ratio)

First conditions: C/Si ratio 0.60, Cl/Si ratio 3.0

Figure 7:
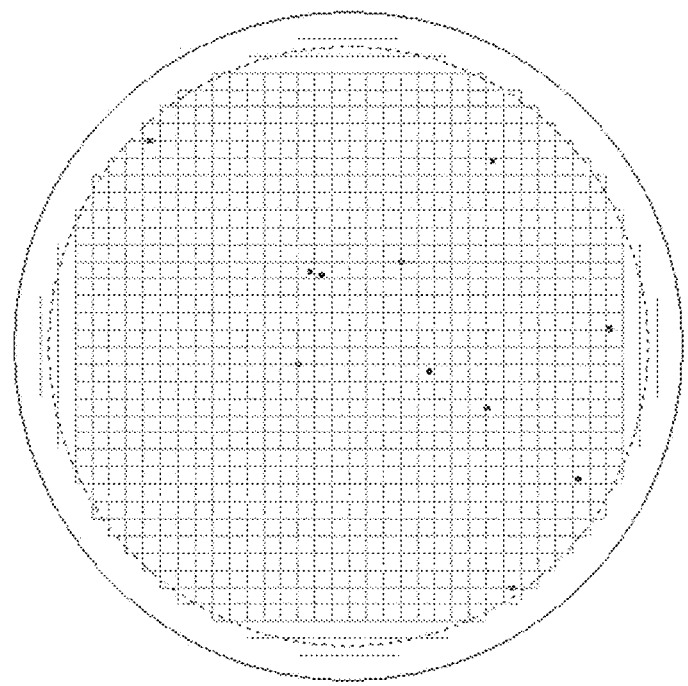
FIG. 7 shows a map of carrot defects on an epitaxial layer surface of a SiC epitaxial wafer of Comparative Example 2.
Figure 8:
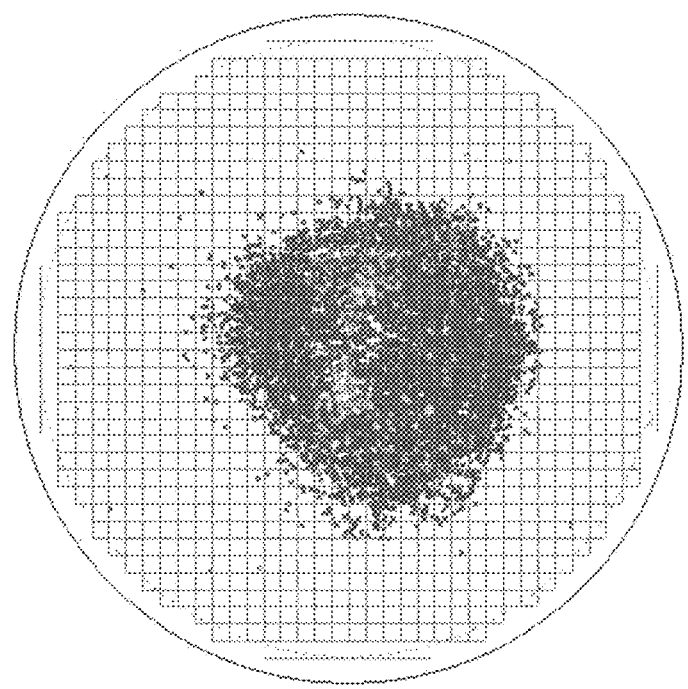
FIG. 8 shows a map of Si droplet-induced defects on the epitaxial layer surface of the SiC epitaxial wafer of Comparative Example 2.

The surface of the obtained SiC epitaxial wafer was measured by the same means as in Example 1. As a result, the number of carrot defects was 11, and Si droplets were observed in large quantities. FIG. 7 shows a map of carrot defects on the epitaxial layer surface of the SiC epitaxial wafer of Comparative Example 2. FIG. 8 shows a map of Si droplet-induced defects on the epitaxial layer surface of the SiC epitaxial wafer.

<4-Inch Substrate>

Example 2

In Example 2, the SiC single crystal substrate was changed to a 4-inch substrate. Other conditions were the same as in Example 1.

Figure 9:
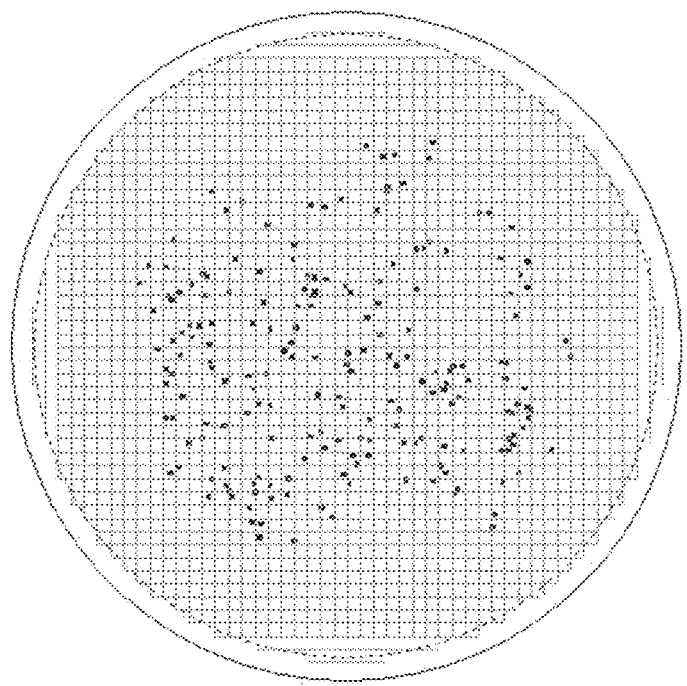
FIG. 9 shows a map of carrot defects on an epitaxial layer surface of a SiC epitaxial wafer of Example 2.

The surface of the obtained SiC epitaxial wafer was measured by the same means as in Example 1. As a result, the number of carrot defects was 194, and almost no Si droplets were observed. FIG. 9 shows a map of carrot defects on the epitaxial layer surface of the SiC epitaxial wafer of Example 2.

Example 3

Example 3 is different from Example 2 in that the time required for the ramping step is reduced to ⅕ of Example 2. Other conditions were the same as in Example 2.

Crystal growth conditions (C/Si ratio, Cl/Si ratio)

First conditions: C/Si ratio 0.6, Cl/Si ratio 5.0

Second conditions: C/Si ratio 1.0, Cl/Si ratio 3.0

Layer thickness of the epitaxial layer formed in the ramping step: 0.1 μm

Layer thickness of buffer layer: 0.5 μm

Figure 10:
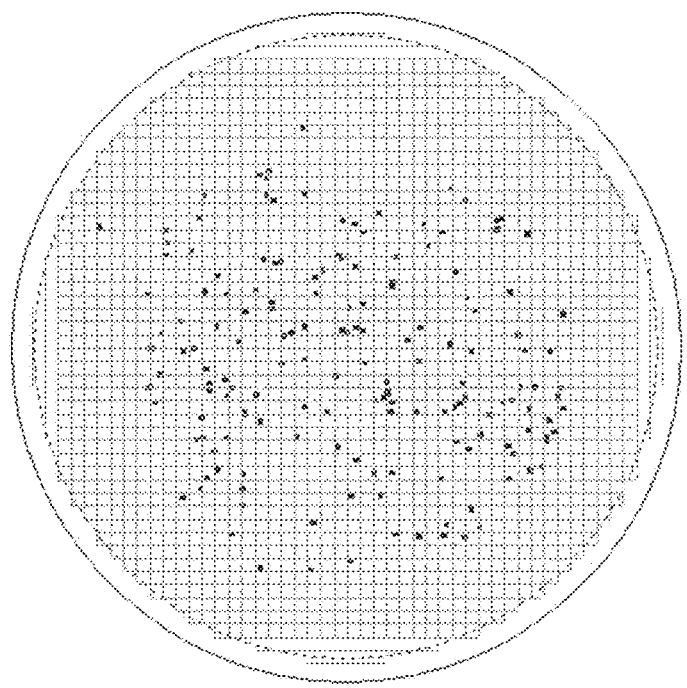
FIG. 10 shows a map of carrot defects on an epitaxial layer surface of a SiC epitaxial wafer of Example 3.

The surface of the obtained SiC epitaxial wafer was measured by the same means as in Example 1. As a result, the number of carrot defects was 164, and almost no Si droplets were observed. FIG. 10 shows a map of carrot defects on the epitaxial layer surface of the SiC epitaxial wafer of Example 3.

Comparative Example 3

In Comparative Example 3, a SiC epitaxial wafer was fabricated under the same conditions as in Example 2 except that the crystal growth conditions were changed.

In Comparative Example 3, the following conditions were adopted as the crystal growth conditions (C/Si ratio, Cl/Si ratio) without changing them in the middle.

Crystal growth conditions: C/Si ratio 1.0, Cl/Si ratio 3.0

That is, Comparative Example 3 is different from Comparative Example 1 in that the size of the SiC single crystal substrate is changed.

Figure 11:
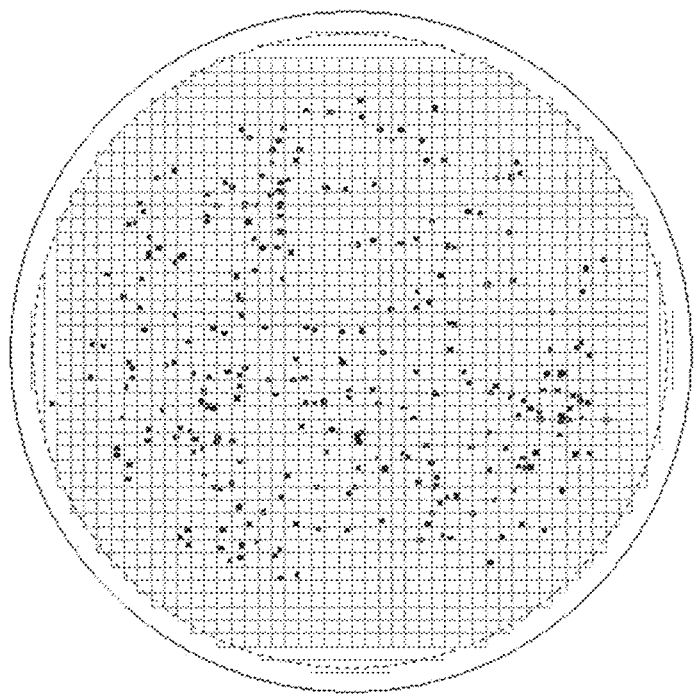
FIG. 11 shows a map of carrot defects on an epitaxial layer surface of a SiC epitaxial wafer of Comparative Example 3.

The surface of the obtained SiC epitaxial wafer was measured by the same means as in Example 1. As a result, the number of carrot defects was 277 which was larger than that in Example 2, and almost no Si droplets were found. FIG. 11 shows a map of carrot defects on the epitaxial layer surface of the SiC epitaxial wafer of Comparative Example 3.

The results of Examples 1 to 3 and Comparative Examples 1 to 3 are shown in the following Table 1.

TABLE 1

| | Substrate size | Crystal growth conditions | | | | Buffer layer thickness (μm) | Layer thickness, among buffer layer, obtained in ramping step (μm) | Number of carrot defects | Amount of Si droplets |
| | | First conditions | | Second conditions | | | | | |
| | | C/Si | Cl/Si | C/Si | Cl/Si | | | | |
|---|---|---|---|---|---|---|---|---|---|
| Ex. 1 | 3 inches | 0.6 | 5.0 | 1.0 | 3.0 | 0.5 | 0.5 | 10 | Small |
| Comp. Ex. 1 | | 1.0 | 3.0 | 1.0 | 3.0 | | 0 | 31 | Small |
| Comp. Ex. 2 | | 0.6 | 3.0 | 1.0 | 3.0 | | 0.5 | 11 | Large |
| Ex. 2 | 4 inches | 0.6 | 5.0 | 1.0 | 3.0 | | 0.5 | 194 | Small |
| Ex. 3 | | 0.6 | 5.0 | 1.0 | 3.0 | | 0.1 | 164 | Small |
| Comp. Ex. 3 | | 1.0 | 3.0 | 1.0 | 3.0 | | 0 | 277 | Small |

By reducing the initial C/Si ratio, the number of carrot defects was reduced by 30 to 40%. Further, by changing the C/Si ratio and the Cl/Si ratio during the growth, it is possible to suppress the occurrence of Si droplets while suppressing the occurrence of carrot defects.

REFERENCE SIGNS LIST

1: SiC single crystal substrate; 2: Epitaxial layer; 1A: Basal plane dislocation; 2A: Prism-plane stacking fault

The invention claimed is:

1. A method of producing a SiC epitaxial wafer having an epitaxial layer on a SiC single crystal substrate, the method comprising:
   when performing crystal growth of said epitaxial layer,
   a step of forming a part of an epitaxial layer under first conditions in which a silane-based gas and a carbon-based gas are supplied, at an initial stage where the crystal growth is started; and
   a step of forming a part of a SiC epitaxial layer under second conditions in which a Cl/Si ratio is decreased and a C/Si ratio is increased in comparison to those in said first conditions,
   wherein the C/Si ratio is equal to or less than 0.6 and the Cl/Si ratio is equal to or more than 5.0 in said first conditions.

2. The method of producing a SiC epitaxial wafer according to claim 1,
   wherein in said first conditions, chlorosilane ($SiH_{4-n}Cl_n$: n=0 to 4) and hydrogen chloride (HCl) are used together as supply sources of Cl element.

3. The method of producing a SiC epitaxial wafer according to claim 1, wherein in said second conditions, the C/Si ratio is from 0.8 to 1.5, and the Cl/Si ratio is from 0 to 4.

4. The method of producing a SiC epitaxial wafer according to claim 1,
wherein when performing crystal growth of said epitaxial layer, a ramping step is performed wherein the C/Si ratio is increased and the Cl/Si ratio is decreased from said first conditions to said second conditions in a stepwise manner or in a slope-like manner.

5. The method of producing a SiC epitaxial wafer according to claim 4,
wherein said epitaxial layer comprises a buffer layer and a drift layer in this order from said SiC single crystal substrate side, and
said ramping step is carried out when growing said buffer layer.

6. The method of producing a SiC epitaxial wafer according to claim 5,
wherein a time required for said ramping step is equal to or more than ⅕ of a time required for forming said buffer layer.

7. The method of producing a SiC epitaxial wafer according to claim 4,
wherein a layer thickness of an epitaxial layer to be grown as crystals in said ramping step is equal to or more than 0.1 μm.

8. The method of producing a SiC epitaxial wafer according to claim 4,
wherein said ramping step is started simultaneously with the start of growth of said epitaxial layer.

9. The method of producing a SiC epitaxial wafer according to claim 1,
wherein the C/Si ratio is from 0.4 to 0.6 in the first conditions.

10. The method of producing a SiC epitaxial wafer according to claim 1,
wherein the epitaxial layer on the SiC single crystal substrate is a SiC epitaxial layer on the SiC single crystal substrate,
the step of forming a part of an epitaxial layer under first conditions is a step of forming a part of the SiC epitaxial layer under first conditions, and
the step of forming a part of a SiC epitaxial layer under second conditions is a step of forming a part of the SiC epitaxial layer under second conditions.

11. The method of producing a SiC epitaxial wafer according to claim 1,
wherein the silane-based gas and the carbon-based gas are supplied together.

* * * * *